(12) United States Patent
Anderl et al.

(10) Patent No.: US 11,789,367 B2
(45) Date of Patent: Oct. 17, 2023

(54) FACET MIRROR FOR AN ILLUMINATION OPTICAL UNIT OF A PROJECTION EXPOSURE APPARATUS

(71) Applicant: Carl Zeiss SMT GmbH, Oberkochen (DE)

(72) Inventors: Willi Anderl, Huettlingen (DE); Christian Körner, Munich (DE); Hubert Holderer, Oberkochen (DE); Markus Holz, Aalen (DE); Manuel Stompe, Planegg (DE); Stefan Seitz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/695,402

(22) Filed: Mar. 15, 2022

(65) Prior Publication Data
US 2022/0206398 A1 Jun. 30, 2022

Related U.S. Application Data

(63) Continuation of application No. PCT/EP2020/076137, filed on Sep. 18, 2020.

(30) Foreign Application Priority Data

Sep. 19, 2019 (DE) .......................... 102019214269.9

(51) Int. Cl.
*G03F 7/20* (2006.01)
*G03F 7/00* (2006.01)

(52) U.S. Cl.
CPC .......... *G03F 7/70075* (2013.01); *G03F 7/702* (2013.01)

(58) Field of Classification Search
CPC .. G03F 7/70075; G03F 7/70116; G03F 7/702; G03F 7/70983; G03F 7/70158; G03F 7/70825; G03F 7/709; G02B 26/0833; G02B 7/1828; F16F 15/03; G21K 1/06
See application file for complete search history.

(56) References Cited

U.S. PATENT DOCUMENTS 9,612,537 B2 * 4/2017 Patra .................. G02B 26/0833
11,054,755 B2 7/2021 Hartjes et al.
(Continued)

FOREIGN PATENT DOCUMENTS

DE 102010003169 A1 2/2011
DE 102009054888 A1 6/2011
(Continued)

OTHER PUBLICATIONS

German Office Action, with translation thereof, for corresponding DE Appl No. 10 2019 214 269.9, dated Apr. 22, 2020.
(Continued)

*Primary Examiner* — Deoram Persaud
(74) *Attorney, Agent, or Firm* — Fish & Richardson P.C.

(57) ABSTRACT

A facet mirror for an illumination optical unit of a projection exposure apparatus has a large number of displaceable individual facets with a facet main body and a reflection surface arranged on it. At least some of the individual facets have a displacement range such that they come into contact with a stop surface in one or more displacement positions.

21 Claims, 16 Drawing Sheets

(56) References Cited

U.S. PATENT DOCUMENTS

| | | | | |
|---|---|---|---|---|
| 2005/0030653 A1* | 2/2005 | Holderer | ............. | G03F 7/70108 |
| | | | | 359/872 |
| 2007/0019310 A1* | 1/2007 | Seifert | ................ | G03F 7/70825 |
| | | | | 359/845 |
| 2011/0063598 A1* | 3/2011 | Fiolka | ................ | G03F 7/70083 |
| | | | | 355/71 |
| 2012/0287414 A1* | 11/2012 | Fiolka | ................ | G02B 26/0833 |
| | | | | 355/77 |
| 2012/0293785 A1 | 11/2012 | Kirch et al. | | |
| 2015/0042974 A1* | 2/2015 | Zimmermann | ..... | G03F 7/70125 |
| | | | | 355/71 |
| 2016/0216509 A1 | 7/2016 | Wakabayashi et al. | | |
| 2017/0176865 A1* | 6/2017 | Deguenther | ............ | G03F 7/702 |
| 2018/0246413 A1* | 8/2018 | Ehm | ........................ | G03F 1/64 |
| 2019/0171118 A1* | 6/2019 | Hartjes | .................. | F16F 15/03 |
| 2022/0057717 A1* | 2/2022 | Fischer | ............... | G03F 7/70133 |

FOREIGN PATENT DOCUMENTS

| | | |
|---|---|---|
| DE | 102016220669 A1 | 8/2017 |
| DE | 102016214785 A1 | 2/2018 |
| DE | 102018201877 A1 | 12/2018 |

OTHER PUBLICATIONS

Translation of International Search Report for corresponding PCT Appl No. PCT/EP2020/076137, dated Jan. 12, 2021.

* cited by examiner

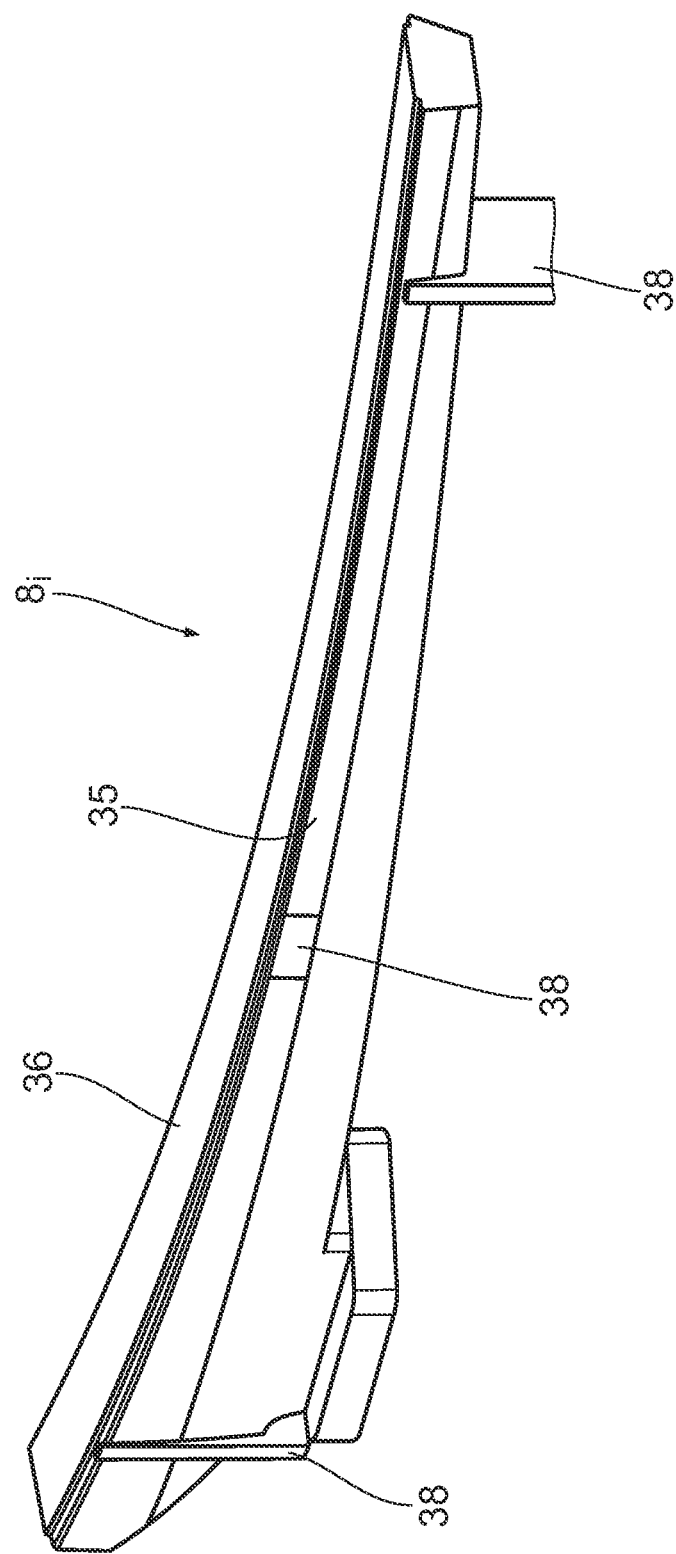

FACET MIRROR FOR AN ILLUMINATION OPTICAL UNIT OF A PROJECTION EXPOSURE APPARATUS

FIELD

The present application is a continuation of, and claims benefit under 35 USC 120 to, international application PCT/EP2020/076137, filed Sep. 18, 2020, which claims benefit under 35 USC 119 of German Application No. 10 2019 214 269.9, filed Sep. 19, 2019. The entire disclosure of these applications are incorporated by reference herein.

BACKGROUND

The disclosure relates to a facet mirror for an illumination optical unit of a projection exposure apparatus. The disclosure further relates to an individual facet for a facet mirror of an illumination optical unit of a projection exposure apparatus. The disclosure also relates to an illumination optical unit, to an illumination system, to an optical system and to a projection exposure apparatus with a corresponding facet mirror. In addition, the disclosure relates to a method for producing a microstructured or nanostructured component and also to a component produced according to the method.

BACKGROUND

Facet mirrors for illumination optical units of projection exposure apparatuses with a large number of displaceable individual facets are known. In this case, the individual facets are formed in such a way that they do not impede one another in the event of a controlled displacement. For example, the facets are formed in such a way that they do not come into contact with one another during displacement.

A mechanism for protecting the facets of the facet mirror against undesired movements, for example when it is being transported, is known. However, generally, the mechanism does not protect the facets during normal operation of the facet mirror.

SUMMARY

The present disclosure seeks to improve a facet mirror for an illumination optical unit of a projection exposure apparatus.

An aspect of the disclosure is to form the individual facets of the facet mirror in such a way that they come into contact with a stop surface in one or more displacement positions. The individual facets of the facet mirror may for example be formed in such a way that they come into contact with a stop surface in reversibly adjustable displacement positions. Such a reversibly adjustable displacement position is also referred to as an active or actuable displacement position. For example, the individual facets may have one or more discrete active displacement positions. They may also be formed in such a way that they only come into contact with a stop surface in the event of an undesired deflection, for example in the event of a parasitic movement, for example in the event of transport and/or an earthquake. Such a deflection is also referred to as a passive displacement position. In case of doubt, the displacement position includes both the actively possible and the passively possible displacement positions.

In this case, the facets can come into contact with the stop surface in each case with their main body or with a stop element arranged on or in it. In this case, the reflection surfaces of the individual facets can be remain contact-free.

The stop surface is for example a defined, for example a predetermined, stop surface. The stop surface is for example a stop surface for two adjacent facets to come up against one another. The stop surface is for example at a distance from the reflection surface of the respective individual facet. For example, the stop surface and the reflection surface of an individual facet form disjoint areas.

The stop surface is for example formed in each case in or on the facet main body. The stop surface may for example be formed or arranged in or on the facet main body in such a way that, in a projection in the direction of a surface normal to the reflection surface of the individual facet, for example in a projection in the direction of a surface normal through the centroid of the reflection surface of the individual facet, it forms an outer boundary of the projection of the facet main body or protrudes beyond such a boundary in at least one direction perpendicularly to the surface normal.

The projection is for example a parallel projection, for example an orthogonal projection.

The projection is for example a projection into a projection plane which is for example perpendicular to the surface normal.

According to the disclosure, it has been recognized that this can prevent the facets from hitting one another in an uncontrolled manner. Hitting one another in an uncontrolled manner is understood here as meaning the facets hitting one another in an uncontrolled, for example an undesired area. For example, it is possible to prevent the reflection surfaces of the individual facets from hitting one another. This can prevent damage to the reflection surfaces.

The individual facets may for example be formed in such a way that they only come into contact with a stop surface in displacement positions that can be actuated and set. For example, an undesired or unforeseeable external effect on the individual facets is not a prerequisite for coming into contact with the stop surface.

The individual facets may also be formed in such a way that they come into contact with the stop surface in the event of an undesired or unforeseeable external influence, for example only in the event of an undesired or unforeseeable external influence.

According to an aspect of the disclosure, at least some of the individual facets, for example all of the individual facets, may have displacement ranges such that adjacent individual facets come into contact in one or more displacement positions. The individual facets may come into contact with one another for example in passive displacement positions.

The individual facets can be arranged without contact, for example arranged at a distance from one another, in a basic or neutral position. For example, they may be arranged at a distance from all stop surfaces in at least one active displacement position, for example in all active displacement positions.

In general, the idea according to the disclosure relates to an optical module with a plurality of displaceable optical elements.

According to an aspect of the disclosure, adjacent individual facets are in each case arranged at a distance from one another by a gap in a basic or neutral position. A corresponding gap may also be present in predetermined switching positions, for example in any desired switching position. For example, the reflection surfaces of the individual facets can be in each case arranged at a distance from one another in the basic or neutral position.

In the basic or neutral position, the individual facets are for example also arranged at a distance from all stop surfaces by a gap.

The gaps can be large enough to allow displacement of the individual facets in the displacement range. On the other hand, the gaps can be as narrow as possible in order to allow dense packing of the individual facets. The width of the gaps between adjacent individual facets may for example be less than 1 mm, for example less than 0.5 mm. The width of the gaps is for example at most 50%, for example at most 30%, for example at most 20%, for example at most 15%, for example at most 10%, for example at most 5%, for example at most 3%, for example at most 2%, for example at most 1% of the extent of the individual facets, for example their main body or their reflection surfaces in the corresponding direction.

For example, the range within which the facet can be actuably displaced is referred to as the displacement range of an individual facet. This range is also referred to as the active displacement range. In addition, it may be possible that the individual facets are displaced as a result of external effects, for example vibrations, for example when the facet mirror is being transported. The range that is possible here is referred to as the passive displacement range. For example, it may be larger than the active displacement range.

Unless otherwise stated, the displacement range of a facet is understood to mean the largest displacement range in each case, for example the larger in each case of the active displacement range and the passive displacement range.

According to an aspect of the disclosure, the total area of the gaps between adjacent individual facets is for example at most 50%, for example at most 30%, for example at most 20%, for example at most 15%, for example at most 10%, for example at most 5%, for example at most 3%, for example at most 2%, for example at most 1% of the total area of the facet mirror or the sum of the reflection surfaces of all individual facets of the facet mirror.

For example, the individual facets have one, two or more degrees of freedom of displacement. For example, they have two tilting degrees of freedom. For example, they may be tiltable around two tilting axes, which for example run perpendicular to one another. They may also be linearly displaceable in a direction parallel to a surface normal, for example at a central point of the reflection surface.

The individual facets, for example their facet main bodies, may in each case be monolithically formed.

In this case, the component part of an individual facet on which the reflection surface is provided is referred to as the facet main body. For example, the facet main body has a cross section which substantially corresponds to the reflection surface. In some embodiments, the cross section of the facet main body deviates for example by at most 30%, for example at most 20%, for example at most 10% from the dimensions of the reflection surface of the respective facet.

For example in the case of a projection, for example in the case of a parallel projection, for example in the case of an orthogonal projection, the facet main body has in the direction of a surface normal to the reflection surface, for example in the area of one of the stop surfaces and/or in the area of one of the stop elements in a direction perpendicular to a surface normal to the reflection surface of the respective individual facet, a cross section which deviates by at most 30%, for example at most 20%, for example at most 10% from the dimensions of the reflection surface of the respective facet. This may for example be a quadrangular, for example elongate, cross section. The cross section may have straight or curved borders. The aspect ratio of this cross section of the facet main body corresponds to that of the reflection surface of the respective individual facet, for example within the stated maximum deviations. In this respect, reference is made to the following description.

The individual facets may also have other component parts, for example elements of an actuator device for displacing the respective facet and/or elements for supporting the facet. Corresponding elements whose cross section deviates significantly, for example by at least 50%, from the reflection surface are not regarded as component parts of the facet main body.

The individual facets, for example their reflection surfaces, can be elongate. They can have an aspect ratio (greatest extent in the longitudinal direction:greatest extent perpendicular thereto, i.e. in the transverse direction) of at least 3:1, for example at least 5:1, for example at least 8:1, for example at least 10:1, for example at least 12:1. The aspect ratio can be at most 100:1, for example at most 50:1, for example at most 30:1, for example at most 20:1.

According to a further aspect of the disclosure, the stop surface with which an individual facet comes into contact in a specific displacement position is formed by another individual facet, for example its main body, for example a predetermined area of the main body or by a separate stop element.

The facet mirror may for example be formed in such a way that two adjacent individual facets can only come into contact when non-actuable degrees of freedom are excited. Such a deflection of the individual facets may occur, for example, in the event of an earthquake or transport load.

Coming into contact with the separate stop element may also be limited to an excitation of degrees of freedom that cannot be actuated, for example in the event of an earthquake or transport load.

According to a further aspect of the disclosure, the facet main body of the individual facets is in each case formed in such a way that adjacent individual facets come into contact in certain deflection or displacement positions in a predetermined area of the facet main body.

For example, it is possible on the basis of the intended displacement range of the individual facets and the geometrical form of the facet main body to predetermine the area thereof in which contact with an adjacent individual facet may occur. This makes it possible to adapt this area specifically to a possible collision.

The area of the facet main body in which contacts may occur can be at a distance from the reflection surface of the respective individual facets, for example from their edges. This can reduce the risk of damage to the reflection surface, for example its edges, due to a collision between adjacent individual facets. This also applies for example to unplanned, for example unforeseeable, collisions, such as can occur, for example, when transporting the facet mirror and/or in the event of an earthquake.

The predetermined area of the facet main body forms for example the stop surface.

According to a further aspect of the disclosure, the facet main bodies are formed in such a way that a distance between the facet main bodies of two adjacent individual facets is smaller than a distance between their reflection surfaces.

This property can be true in the basic position of the individual facets. It can be generally applicable, regardless of the displacement positions of the individual facets. A corresponding form of the facet main bodies is described in more detail below.

According to a further aspect of the disclosure, one or more stop elements are provided in each case on or in the facet main body.

The stop elements can serve as buffers. To a certain extent, they can serve as bumpers. They can allow the areas in which adjacent individual facets can come into contact with one another to be specified in a targeted manner; for example, they allow the stop surfaces to be specified in a targeted manner.

The stop elements can be formed as separate elements and in each case connected to the facet main body. For example, they can be connected to the facet main body in a form-fitting manner.

According to an aspect of the disclosure, the stop elements are connected to the facet main body by gluing, soldering, welding, screwing, clipping, shrinking or fitting on. In principle, all conceivable connection techniques for connecting the stop elements to the facet main bodies are possible.

For example, the stop elements may be exchangeable. The stop elements may also be formed in one piece with the facet main bodies. This can allow relatively simple and stable production. The stop elements can be arranged at predetermined positions, for example in the area of crests, corners, edges or other predetermined positions of the facet main bodies.

The stop elements may extend over the entire width and/or over the entire length of the facet main body. For example, they may extend over the entire circumference of the facet main body. As an alternative to this, it is possible to provide a plurality of stop elements, which have in each case a smaller extent. This can allow weight to be saved. This can have a positive effect on the mechanical properties of the individual facets.

It may for example be envisaged to arrange in each case one or more stop elements at the ends of the facet main body, for example in the area of its ends in the longitudinal direction. It is also possible to arrange one or more stop elements on the facet main body in a central area, for example in a central area with regard to the longitudinal direction. This can be desirable in the case of curved facets.

The stop elements may be provided for example in each case in the areas in which collisions are most likely to occur. For example, they may be arranged in the areas in which the distance between the respective facet main body and an adjacent facet main body is minimal. This statement may relate to the position of the facet main bodies in a neutral, that is to say non-deflected, basic state and/or to a displacement position of adjacent facet main bodies in which their distance is minimal.

The stop elements may be formed from the same material as the facet main body. For example, they may be formed from copper or a copper alloy. They may also be produced from or consist of other materials. Other materials that may be considered for the stop elements are, for example, Zerodur, ULE, aluminum, ceramic, quartz and silicon.

The stop elements may be provided with a coating, for example a wear-resistant coating. As a result, particle abrasion can be reduced, for example prevented.

According to a further aspect of the disclosure, the stop elements protrude laterally beyond the reflection surface. They protrude laterally beyond the reflection surface for example when viewed from above. They protrude laterally beyond the reflection surface for example in the transverse direction.

The stop elements have for example an extent in the direction parallel to the reflection surface which is greater than the extent of the reflection surface in this direction. The stop elements have for example an extent in the direction parallel to the width of the reflection surface which is greater than the width of the reflection surface.

In this way, damage to the reflection surface in the event of a collision can be effectively and reliably prevented.

According to a further aspect of the disclosure, the stop elements protrude beyond the facet main body in the opposite direction to the surface normal of the reflection surface. They protrude beyond the facet main body for example on the side of the facet main body opposite from the reflection surface.

The stop elements may also have an extent in a direction parallel to a surface normal of the reflection surface which is smaller than the extent of the facet main body in this direction.

According to a further aspect of the disclosure, all of the individual facets of the facet mirror have in each case identical stop elements and/or stop elements at substantially identical positions.

This can simplify the production of the individual facets and the programming of the facet contours.

In some cases, as an alternative to this, different individual facets may have different stop elements and/or stop elements at different positions. It is possible for example to provide each of the individual facets individually with one or more stop elements. This can allow greater flexibility in planning the facets.

The alikeness and/or the differences of the stop elements may relate here in each case to their shape and/or their arrangement on the respective individual facets.

According to a further aspect of the disclosure, the stop elements have an extent which extends over the entire length of an individual facet. The stop elements may for example extend over the entire circumference of an individual facet.

As a result, the individual facet can be protected in a relatively reliable manner.

According to a further aspect of the disclosure, the individual facets, for example their main bodies, have a mechanism for reducing weight and/or a weight-reduced form.

For example, bores, clearances, pockets, thinnings or bevels may serve as a mechanism for reducing weight.

According to a further aspect of the disclosure, the facet mirror has one or more mechanisms for limiting the displacement range of the individual facets. The facet mirror may for example have one or more mechanisms for limiting undesired deflection, for example for limiting parasitic movements of the individual facets.

In this case, the mechanism for limiting the displacement range, for example the mechanism for limiting the undesired parasitic movements of the individual facets, may form the stop surface.

The mechanism for limiting the displacement range of the individual facets may be formed as pins, which are also referred to for example as snubbers, forks, pockets or U-profiles.

The play of the respective stop surfaces can be smaller than the facet gap in relation to the adjacent individual facet.

According to a further aspect of the disclosure, the free end of the mechanism for limiting the displacement range of an individual facet is arranged in the region of the axis of rotation. As a result, the play of the individual facet around the mechanism for limiting the displacement range thereof can be reduced. For example, this does not reduce the available play of the individual facets as a result of their actuation around the axis of rotation.

In order to further reduce the play, it may be envisaged to adjust the mechanism for limiting the displacement range of the individual facets.

It may for example be envisaged to measure the gaps between the individual facets and/or to determine special spacers and arrange them on the facets and/or to make the stops adjustable or settable.

The disclosure seeks to improve individual facets for a facet mirror of an illumination optical unit of a projection exposure apparatus, for example according to the preceding description.

In some embodiments, the disclosure provides individual facets with a facet main body and a reflection surface arranged thereon and one or more stop elements provided on or in the facet main body.

The potential advantages are evident from those already described.

According to an aspect, one or more stop surfaces and/or stop elements which, in a projection in the direction of a surface normal to the reflection surface, protrude beyond the reflection surface in at least one direction perpendicularly to this surface normal are provided on or in the facet main body.

Here, the surface normal is for example the surface normal through the centroid of the reflection surface.

According to an aspect, the individual facets have one or more stop surfaces and/or stop elements which, in a projection in the direction of a surface normal to the reflection surface, protrude beyond the reflection surface both in at least one direction perpendicularly to this surface normal and in an opposite direction.

According to an aspect, the individual facets have one or more stop surfaces and/or stop elements which, in a projection in the direction of a surface normal to the reflection surface, protrude beyond the reflection surface over the entire circumferential area of the reflection surface.

The stop elements may be a special form of the facet main body, for example a thickening thereof. The main body can be at least partially wider than the reflection surface of the individual facet.

The stop elements may also be separate components which are connected to the facet main body.

The reflection surfaces of the individual facets may be flat. They may also have a positive or negative refractive power. They may also be toric.

The reflection surfaces of the individual facets may for example be rectangular, trapezoidal or curved, for example in the form of a segment of a circular ring.

According to a further aspect of the disclosure, the facet main body has at least one free end, for example two free ends, and is formed in such a way that its cross section decreases toward the free end or toward the free ends.

The cross section of the facet main body can decrease, for example at least in sections, from an attachment area toward the free end or ends.

The cross section may for example decrease continuously, for example monotonically, toward the free end. This can allow the mass moment of inertia to be reduced. The cross section of the facet main body may also contribute to increasing the rigidity of the facet main body.

The cross section may also increase again on the very outside, in the area of the free end. In the area of the free end, the facet main body may for example have a stop element.

According to a further aspect of the disclosure, the facet main body has a mechanism for reducing the mass moment of inertia thereof and/or a mechanism for increasing the rigidity thereof.

Clearances, bores or, in general, a weight-reduced form of the facet main body may serve as a mechanism for reducing the mass moment of inertia of the facet main body.

A profiled form thereof may serve as a mechanism of increasing the rigidity of the facet main body. The facet main body may for example have a T-shaped, a U-shaped or an H-shaped cross section, at least in sections. The facet main body may also be additively manufactured. For example, it may have hollow structures. This can allow the mass moment of inertia of the facet main body to be reduced relatively effectively.

The disclosure also seeks to improve an illumination optical unit for a projection exposure apparatus, an illumination system for a projection exposure apparatus, an optical system for a projection exposure apparatus and a projection exposure apparatus.

In some embodiments, the disclosure provides an illumination optical unit, an illumination system, an optical system and a projection exposure apparatus with a facet mirror according to the preceding description.

The embodiments according to the disclosure offer for example improved protection, for example of the optical surfaces, during transport and in the event of earthquake loads.

The potential advantages result from those of the facet mirror.

The disclosure also seeks to improve a method for producing a microstructured or nanostructured component and also a correspondingly produced component.

In some embodiments, the disclosure provides a projection exposure apparatus according to the preceding description.

The potential advantages result in turn from those of the facet mirror, to which reference is made.

BRIEF DESCRIPTION OF THE DRAWINGS

Further features and details of the disclosure will become apparent from the description of exemplary embodiments with reference to the figures, in which:

FIG. 27 shows by way of example a further cross section of a stop element for protecting a facet and FIG. 28 shows by way of example a perspective view of a facet with three stop elements.

DESCRIPTION OF EXEMPLARY EMBODIMENTS

Figure 1:
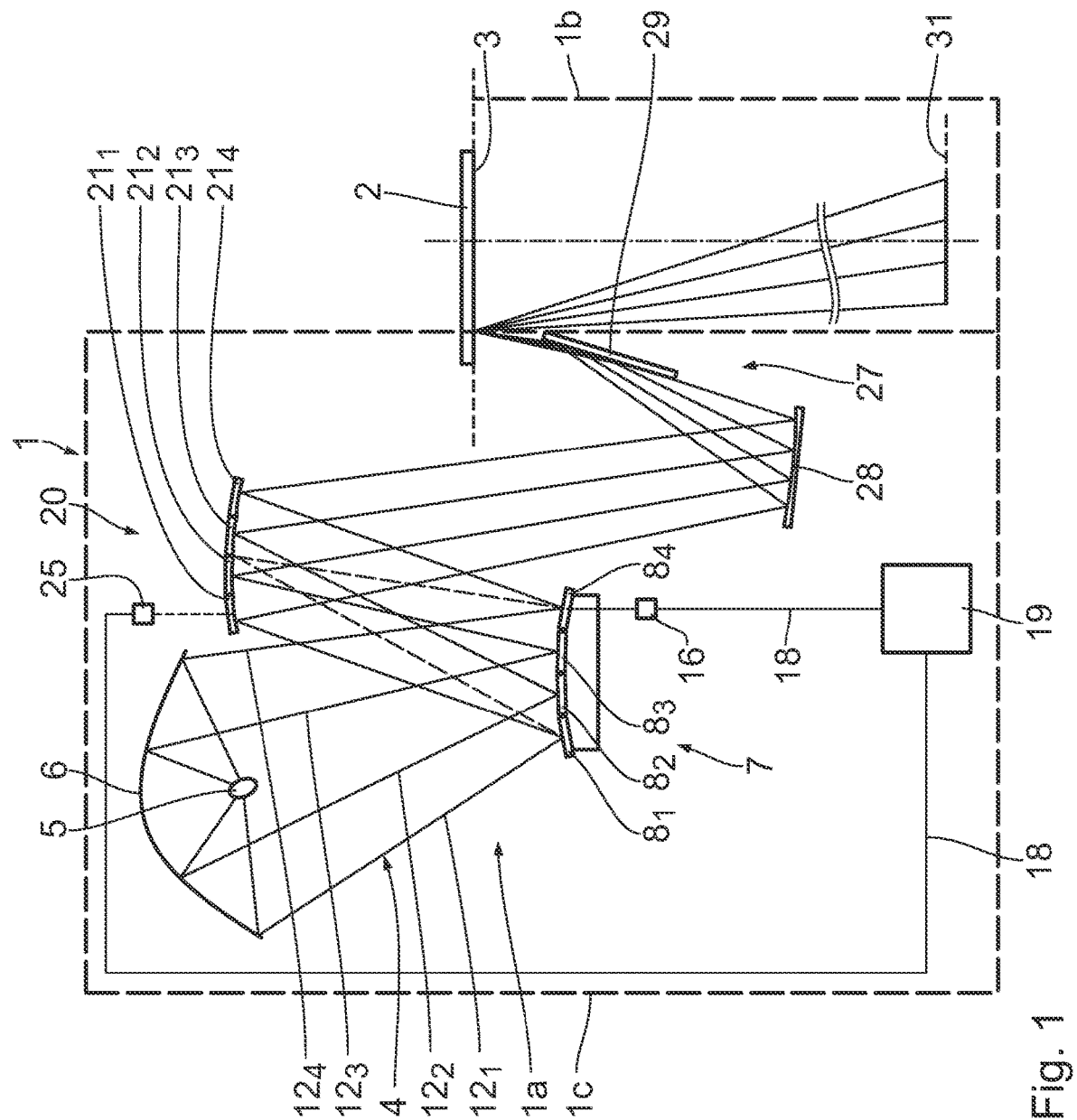
FIG. 1 schematically shows the component parts and the beam path of a projection exposure apparatus, FIG. 2 schematically shows an exemplary arrangement of field facets on a field facet mirror, FIGS. 3 and 4 schematically show an actuator device for displacing a field facet around two independent tilting axes, FIG. 5 schematically shows a further detail to clarify the relative position of the tilting axis of a field facet relative to its reflection surface, FIG. 6 schematically shows by way of example the collision of two adjacent facets during a rotation around an axis parallel to their surface normal.

In the following, first the general structure and beam path in a projection exposure apparatus 1 are described with reference to FIG. 1.

The projection exposure apparatus 1 includes an illumination optical unit 1a for illuminating an object field 2 in an object plane 3 with illumination radiation 4. The projection exposure apparatus 1 also includes a projection optical unit 1b for imaging a reticle, which is not shown in FIG. 1, is arranged in the area of the object plane 3 and has structures to be imaged on a wafer, which is likewise not shown in FIG. 1 and is arranged in an image plane 31. Details are widely known.

The illumination radiation 4 may be for example EUV radiation, for example illumination radiation with a wavelength of at most 30 nm, for example of 13.5 nm or less.

The illumination radiation 4 is produced by a radiation source 5. A plasma source or a free electrode laser (FEL) may serve as the radiation source 5. For details, reference is again made to known technology.

The combination of the illumination optical unit 1a and the radiation source 5 is also referred to as the illumination system 1c.

The illumination radiation 4 emitted by the radiation source 5 is collected by a collector 6. The collector 6 reflects the illumination radiation 4 and guides it to the following components of the illumination optical unit 1a.

In the beam path after the collector 6, the illumination radiation 4 impinges on a first optical element in the form of a first facet mirror 7, which is also referred to as a field facet mirror. The first facet mirror 7 serves for producing secondary light sources in the illumination system 1c.

A total reflection surface of the first facet mirror 7, which is acted upon by the illumination radiation 4, is divided into a plurality of first facets $8_i$, which are also referred to as field facets. In FIGS. 1 and 2, four first facets $8_1$ to $8_4$ are schematically indicated.

Figure 2:
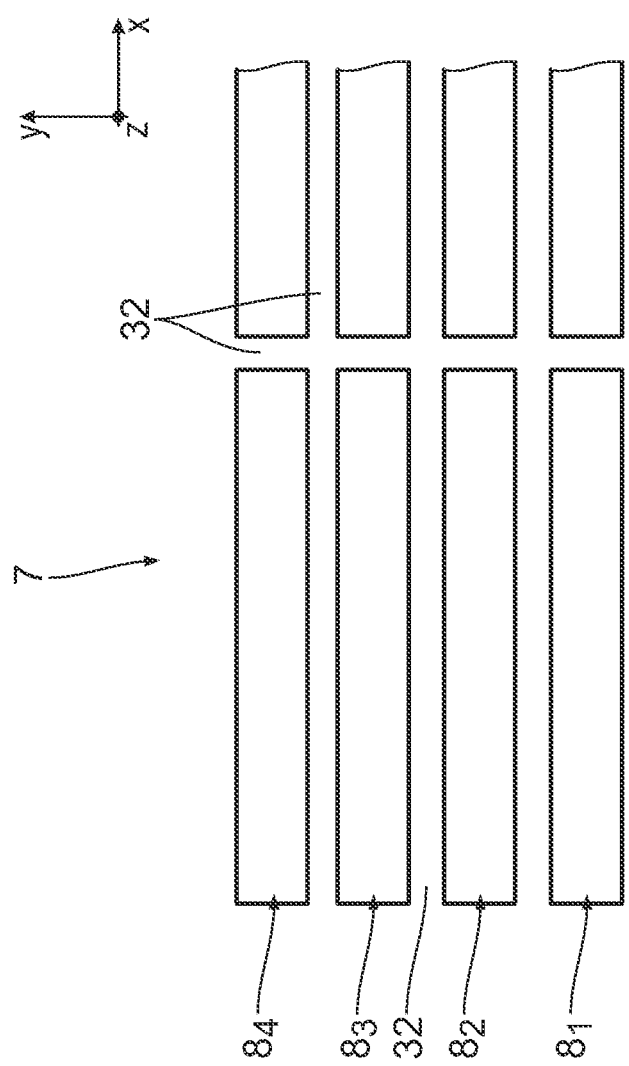

Sub-bundles $12_i$ of the illumination radiation 4 are likewise indicated schematically and by way of example in FIG. 1, for example the sub-bundles $12_1$ to $12_4$ of the illumination radiation 4 assigned to the four first facets $8_1$ to $8_4$ shown.

The first facets are usually of an elongate form. They may be rectangular. They may also be curved, for example in the form of a segment of a circular ring.

The first facets may all have identical dimensions. It is also possible to form the first facet mirror 7 with first facets of different dimensions.

The first facets may for example have an aspect ratio of at least 5:1, for example at least 8:1, for example at least 12:1, for example at least 13:1. The aspect ratio of the first facets is for example at most 100:1, for example at most 50:1.

The shape of the first facets may be adapted for example to the shape of the object field 2. It may for example be geometrically similar to the shape of the object field 2. The shape of the first facets is for example such that the illumination radiation 4 reflected by them illuminates the object field 2 or predetermined partial areas thereof as exactly as possible during operation of the projection exposure apparatus 1.

Each of the first facets can be displaced, for example tilted, to set different illumination settings. The first facets can for example be tilted around two axes that are perpendicular to one another.

A Cartesian (x, y, z) coordinate system is used below to describe positional relationships. In this coordinate system, the first facets can in each case be tilted around a tilting axis running in the x direction and around a tilting axis running in the y direction. The z axis is for example parallel or almost parallel to a surface normal of the respective facet.

Actuators are respectively provided for displacing the first facets, one of which, an actuator 16, is representatively indicated in FIG. 1. The actuator 16 is connected to a central control device 19 via a control line 18. The control device 19 is connected by way of corresponding control lines that are not shown in FIG. 1 to all other actuators assigned to the first facets.

For further details of the first facets, reference is made to US 2003/0086524 A1, for example FIGS. 7 to 14, to which reference is made in full.

A second optical element in the form of a second facet mirror 20 is arranged at the location of the secondary light sources generated by the first facet mirror, that is to say in an image plane in relation to the radiation source 5. The second facet mirror 20 is also referred to as a pupil facet mirror. The pupil facet mirror is impinged upon by the illumination radiation 4 via the first facet mirror 7.

The surface of the second facet mirror 20 that can be impinged upon is divided into a plurality of second facets $21_i$, of which four second facets $21_1$ to $21_4$ are shown by way of example in FIG. 1. The second facets $21_1$ to $21_4$ are in each case assigned to one of the first facets 8 to 11, so that at the location of the respectively impinged-upon second facets $21_1$ to $21_4$ in each case a secondary light source is generated.

As schematically indicated in FIG. 1, the second facets may also be tiltable using actuators. By way of example of this, an actuator 25 assigned to the second facet 21 is shown in FIG. 1. The actuator 25 is in signaling connection with the control device 19 via a beam line 18.

A transmission optical unit 27 with further mirrors 28, 29 is arranged in the beam path after the second facet mirror 20. In this case, the mirror 28 can be impinged upon by the illumination radiation 4 with a small angle of incidence, for example an angle of incidence of less than 30°. The mirror 29 may be impinged upon with grazing incidence, for example with an angle of incidence of more than 60°.

The preceding description of the projection exposure apparatus 1 should be understood as by way of example. Other embodiments of the illumination system 1c, as are known, are also possible.

Further details of the facets are described below. Even if the following description and the figures relate to facets of the first facet mirror 7, the described aspects are equally possible and potentially advantageous for the facets of the second facet mirror 20.

In FIG. 2, the plan view of a detail from the surface of the first facet mirror 7 is shown by way of example.

As shown by way of example in FIG. 2, there are many facets $8_i$ arranged next to one another on the facet mirror 7. Here, adjacent facets $8_i$, $8_{i+1}$ are in each case separated from one another by a gap 32. In the variant shown in FIG. 2, the gaps 32 run parallel to the x or y direction.

In order to keep reflection losses as low as possible, the gaps 32 are as narrow as possible. The gap width is for example at most 1 mm. The gap width is for example at most 50%, for example at most 30%, for example at most 20%, for example at most 15%, for example at most 10%, for example at most 5%, for example at most 3%, for example at most 2%, for example at most 1% of the extent of the facets $8_i$ in the corresponding direction.

In some embodiments, at most 50%, for example at most 30%, for example at most 20%, for example at most 15%, for example at most 10%, for example at most 5%, for example at most 3%, for example at most 2%, for example at most 1% of the total area of the first facet mirror 7 is covered by gaps 32. The illumination radiation 4 cannot be reflected at the gaps 32. The gaps 32 thus lead to transmission losses.

On the other hand, the gaps 32 are present to allow a certain actuation range of the facets $8_i$.

Figure 3:
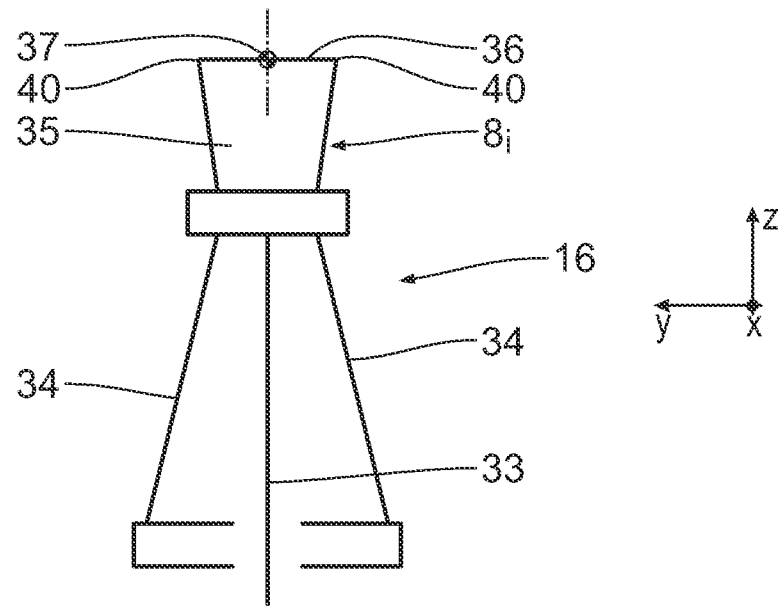
Figure 4:
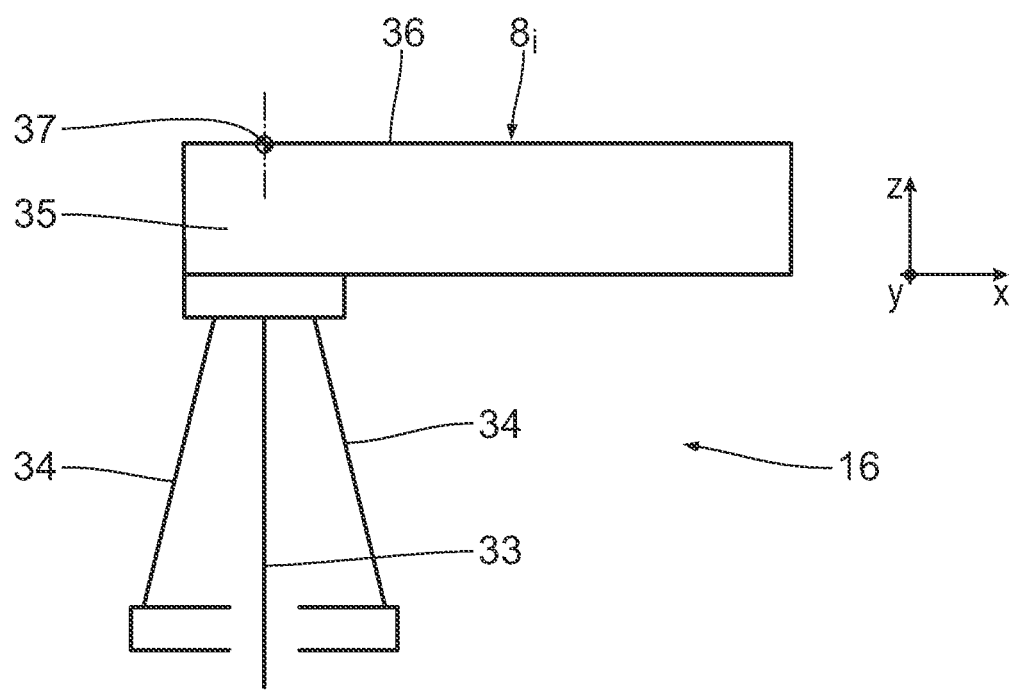

FIGS. 3 and 4 show schematically and by way of example details of the actuators 16 for displacing the facets $8_i$. Actuation takes place by way of a lever 33. This can take place by magnetic forces. The magnet is located for example on the underside of the lever 33.

Provided thereunder are energized coils, which can cause the lever 33 to be deflected and consequently the facet $8_i$ to be tilted. The actuator 16 may also have one or more restoring elements, for example in the form of leaf springs 34.

The facets $8_i$ have in each case a facet main body 35 and a reflection surface 36. The reflection surface 36 has edges 40 at the periphery.

The facets $8_i$ may be attached to a common frame or a common plate. It is also possible to attach the facets $8_i$ in groups on modular plates.

The reflection surface 36, which is also referred to generally as an optical surface, may be flat. However, it may also be curved. It may for example be formed a for example concavely or convexly. It may also be toric or have any other shape.

Figure 5:
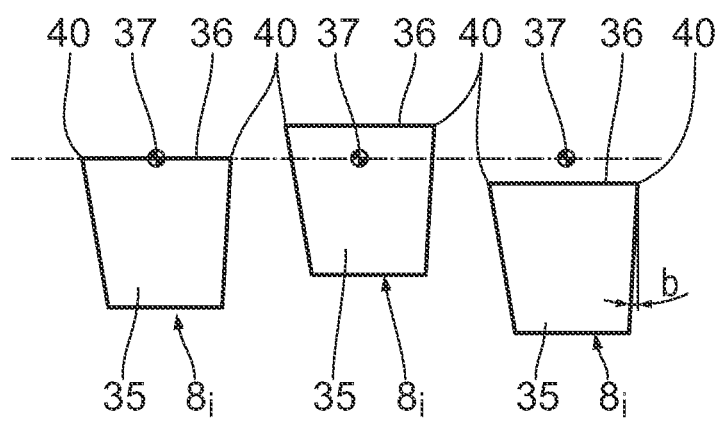

As shown by way of example in FIG. 5, the tilting axes 37 may lie in the area of the reflection surface 36 (on the left in FIG. 5). The tilting axis 37 may also lie below, that is to say behind, the reflection surface 36 (in the middle in FIG. 5). The tilting axis 37 may also lie above, that is to say in front of, the reflection surface 36 (on the right in FIG. 5). The position of the tilting axis 37 in relation to the reflection surface 36 has an influence on the width of the gap 32 in order to ensure that adjacent facets $8_i$, $8_{i+1}$ are free from collisions over a specified tilting angle range (tilting range).

The facet main body 35 may have, at least in sections, a cross section that decreases in the direction perpendicular to the reflection surface 36, for example a trapezoidal cross section. A side angle b may for example be as large as the maximum tilt angle to be set. It may also be larger. The dimensions of the facet main body 35, for example its mass moment of inertia, can be reduced by a larger side angle b, for example a greater bevel, of the facet main body 35.

Depending on the method of attachment, the individual facets $8_i$ may have a low natural frequency, which is excited for example during transport or in the event of unexpected shocks, such as in an earthquake. This can lead to collisions between adjacent facets $8_i$, $8_{i+1}$.

Figure 6:
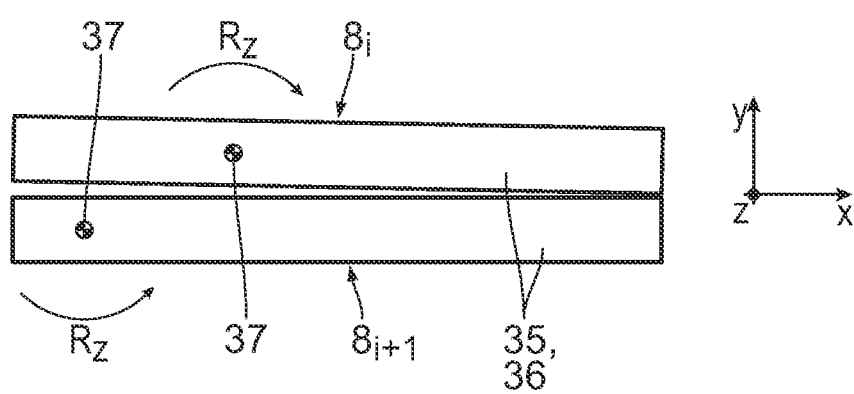

FIG. 6 shows by way of example a collision between two adjacent facets during a rotation thereof around their z axis, which runs parallel to a surface normal on a central point of the reflection surface 36. Such a collision can lead to indentations at the optical edges, that is to say in the peripheral area of the reflection surface 36.

While the facets $8_i$, $8_{i+1}$ the controller can be tilted around the x and y axes, a rotation around the z axis is undesirable in normal operation of the projection exposure apparatus 1. However, such a rotation around the z axis can be excited in the case of transport and earthquakes. This may lead to damage of the facets $8_i$, $8_{i+1}$, which is usually to be avoided.

Different concepts for avoiding, for example preventing, a collision of adjacent facets $8_i$, $8_{i+1}$ are known from the prior art. Such concepts are usually complex. It has also been found that their effectiveness is often insufficient.

According to the disclosure, these issues can be solved by a controlled collision of the optical component, for example the facets $8_i$, being allowed. Here it is envisaged according to the disclosure to form the facet main body 35 and the reflection surface 36 in each case in such a way that the reflection surface 36 is not damaged in the event of a collision. This can be achieved for example by providing the facet main body 35 with defined stop surfaces, which are arranged at a distance from the reflection surface 36 of the respective facet $8_i$ and in the area of which contacts can occur. As will be described in more detail below, separate stop elements against which the facet main body 35 can strike can also serve as stop surfaces.

The stop surface may be formed for example by a predetermined area of an adjacent facet or by an additional mechanical component.

The distance between the facet main body and the respectively associated stop surface is for example smaller than the width of the gap 32 in the corresponding direction. The distance between the facet main body 35 and the associated stop surface is for example smaller than the distance between the reflection surface 36 and the stop surface or the reflection surface 36 of the adjacent facet. This ensures that, in the event of a collision, it is not the optical edges, that is to say the edges of the reflection surface 36, that collide, but rather the desired stop areas.

Figure 7:
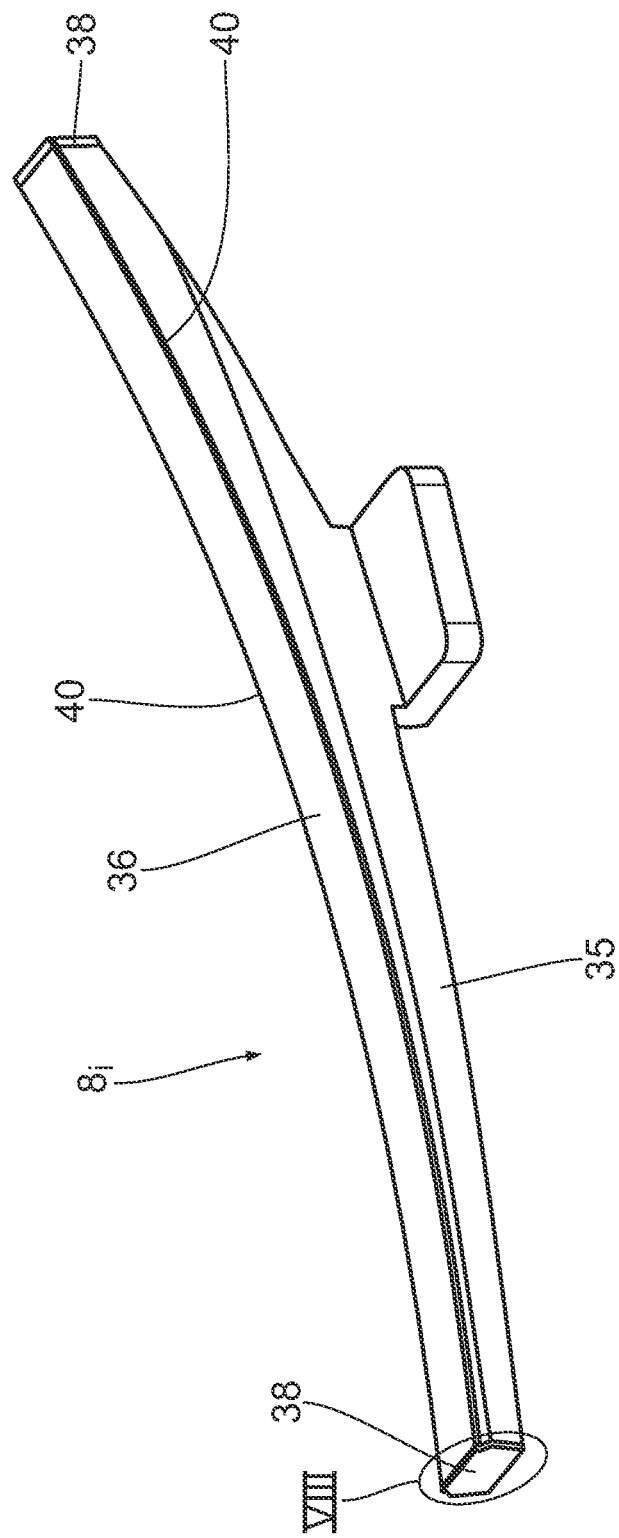
FIG. 7 shows by way of example a perspective view of an individual facet.

FIG. 7 shows by way of example a perspective view of a facet $8_i$.

In the variant shown in FIG. 7, stop elements 38 are provided at the ends on the facet main body 35. A side view through the facet according to FIG. 7 is shown by way of example in FIG. 9.

Figure 8:
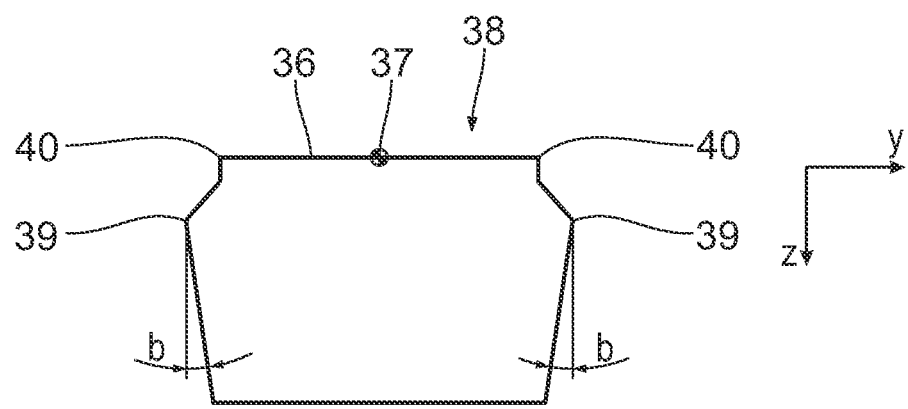
FIG. 8 shows by way of example a cross section of a stop element for protecting a facet.

FIG. 8 shows a cross section of the stop element 38 in detail. The stop element 38 has for example stop edges 39.

The stop edges 39 are offset outward in the direction perpendicular to the tilting axis 37 in relation to the edges 40 of the reflection surface 36.

Figure 27:
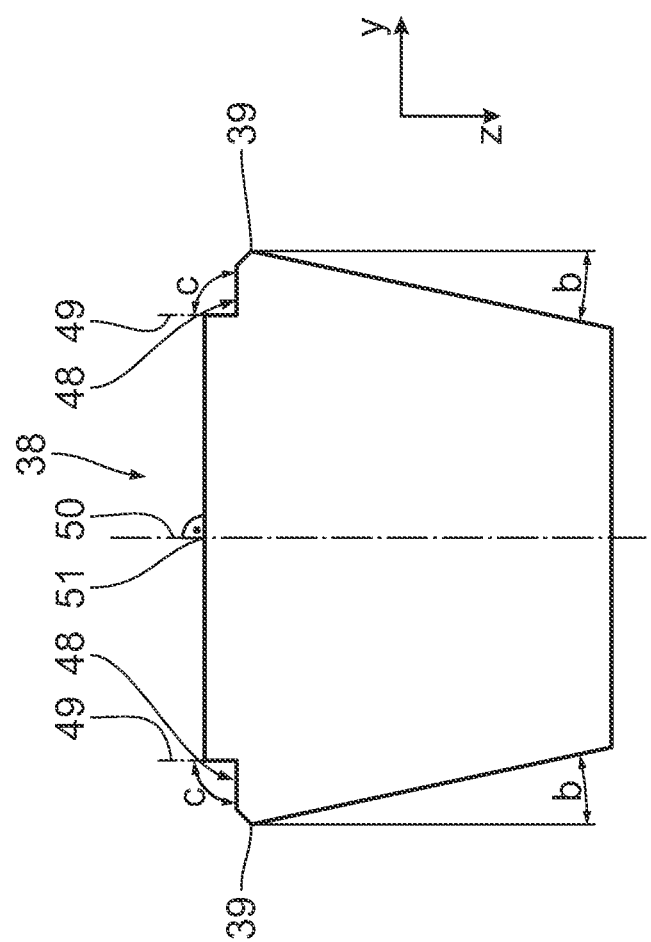

A cross section of a variant of the stop element 38 is shown in FIG. 27. The stop element 38 according to FIG. 27 has a shoulder 48 on both sides of the reflection surface 36. The shoulder 48 extends for example in a direction parallel to a width of the facet. It leads to improved protection of the reflection surface 36, for example its edges 40.

Intermediate stages between the form of the stop element 38 according to FIG. 27 and the embodiment according to FIG. 8 are similarly possible. The shoulder 48 may for example be oriented at an angle c in the range of 90° to 150°, for example in the range of 90° to 135°, such as at least 100°, in relation to a vertical direction 49. Here, the vertical direction 49 runs for example parallel to a surface normal 50 through a central point 51 of the reflection surface 36.

The stop edge 39 may be rounded or chamfered.

Figure 9:
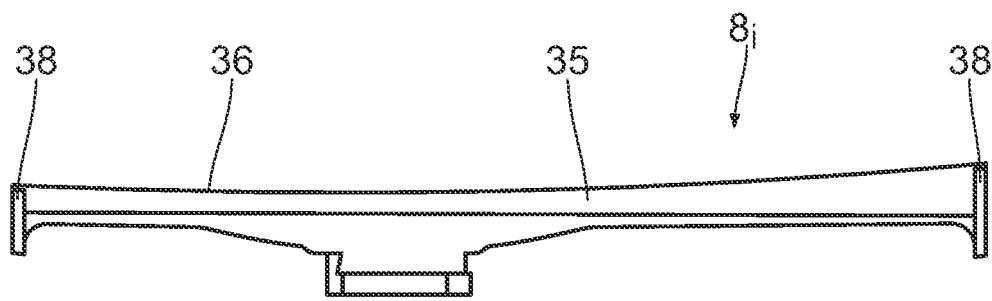
FIG. 9 shows by way of example a side view through a facet according to FIG. 7 with two stop elements arranged at the ends, FIG. 10 schematically shows a representation according to FIG. 6, the facets being protected by stop elements.
Figure 10:
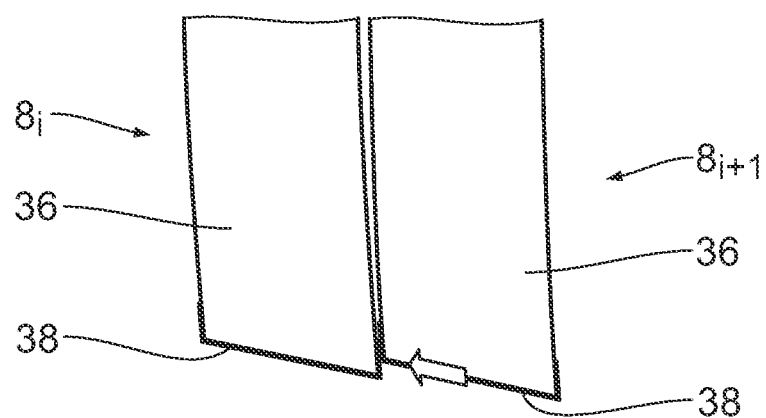

As shown by way of example in FIG. 9, the stop elements 38 protrude downward beyond the facet main body 35, that is to say to the side of the facet main body 35 that is facing away from the reflection surface 36. The vertical overhang may be determined on the basis of the desired tilting range of the facets $8_i$. The tilting range of the facets $8_i$ may be for example up to 100 mrad.

The stop elements 38 may be plate-shaped. They may also be formed in the manner of a sleeve to enable them to be fitted onto the facet main body 35.

The stop elements 38 may in each case be arranged on the free ends of the facet main body 35 in the longitudinal direction.

They may also surround on three sides the end of the facet main body 35 that is free in the longitudinal direction. A corresponding form is shown by way of example in FIG. 10. Such a form of the stop elements 38 protects the facets $8_i$, $8_{i+1}$, for example their reflection surfaces 36, for example also in the event of a collision due to a rotation around the z axis.

The stop elements 38 can be formed and/or arranged on the facet main body 36 in such a way that, in any tilted position, for example in any operational-switching position, of the facets $8_i$, any, for example also unexpected, excitations, for example also around the z axis, lead at most to collisions in the area of the stop elements 38, but not in the area of the edges 40 of the reflection surface 36.

As shown by way of example in FIG. 28, stop elements 38 may also be arranged in a central area on the facet main body 35. This can be advantageous for example in the case of curved facets $8_i$.

The stop elements 38 can be arranged in the region or regions in which the distance between the respective facet main body 35 and the adjacent facet main body 35 or the adjacent stop element 38 is at its smallest. The stop elements 38 are arranged for example in those areas of the facet main body 35 in which collisions are most likely to occur.

As shown by way of example in FIG. 28, the stop elements 38 arranged in the area of the free ends of the facet main body 35 also need not be arranged completely at the ends on the facet main body 35.

As shown by way of example in FIG. 28, different stop elements 38 may have different geometrical forms. For example, it is possible to form the stop elements 38 arranged in the central area of the facet main body 35 differently than the stop elements 38 arranged further toward the end. For example, it is possible to form the stop elements 38 arranged in a central area on the facet main body 35 in such a way that they have an extent in the direction perpendicular to the reflection surface 36 which is less than the extent of the facet main body 35 in this direction.

For example, the stop elements 38 arranged in the central areas of the facet main body 35 may be formed as thickenings of the facet main body 35.

The stop elements 38 arranged in the central areas of the facet main body 35 may only be arranged on a single side of the facet main body 35. It is also possible to arrange corresponding stop elements 38 on two sides, that is to say on opposite sides of the facet main body 35.

An arrangement of the stop elements 38 in the areas in which the width of the gap 32 is relatively small, for example minimal, makes it possible to form the stop elements 38 as relatively thin, and therefore relatively light.

The stop elements 38 are formed for example in such a way that contact with a stop surface can occur when the facets $8_i$ are displaced and/or due to unexpected excitations of the facets $8_i$, whereby the facets $8_i$ come into contact with the stop surface in a predetermined area arranged at a distance from the reflection surface 36.

Figure 11:
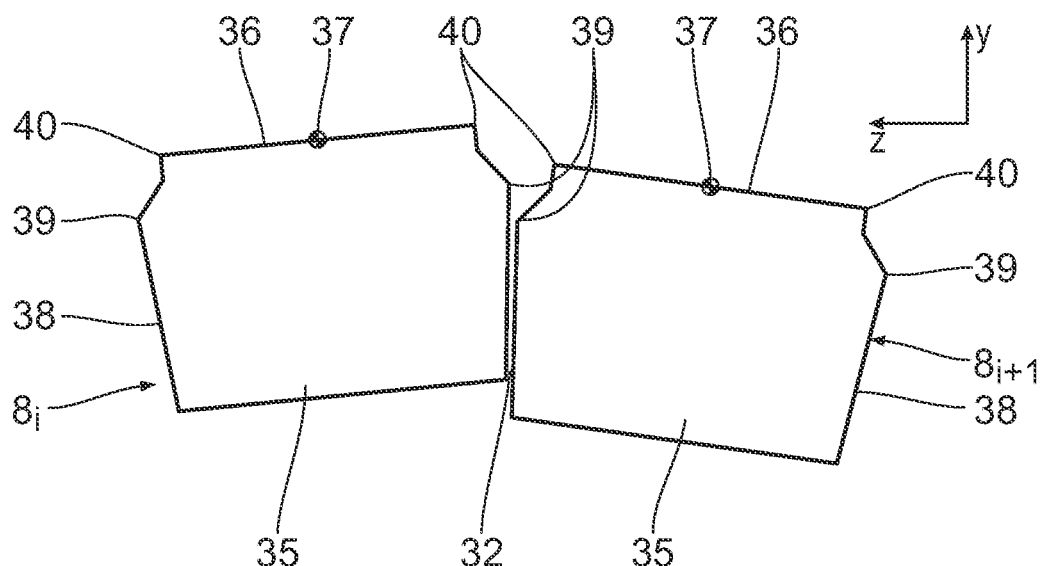
FIG. 11 to 13 show schematic representations to illustrate different tilting situations of two adjacent facets, FIGS. 14 and 15 schematically show two different arrangements of stop elements on facets.
Figure 12:
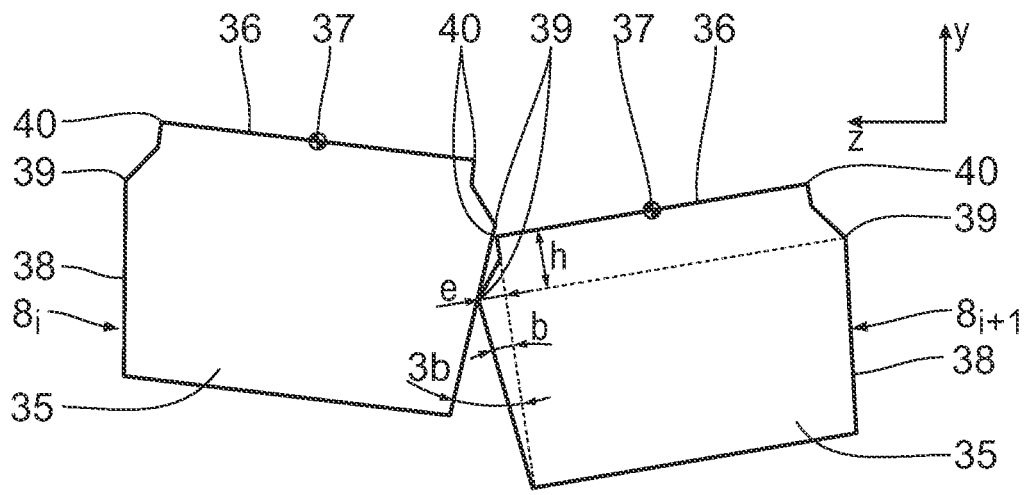
Figure 13:
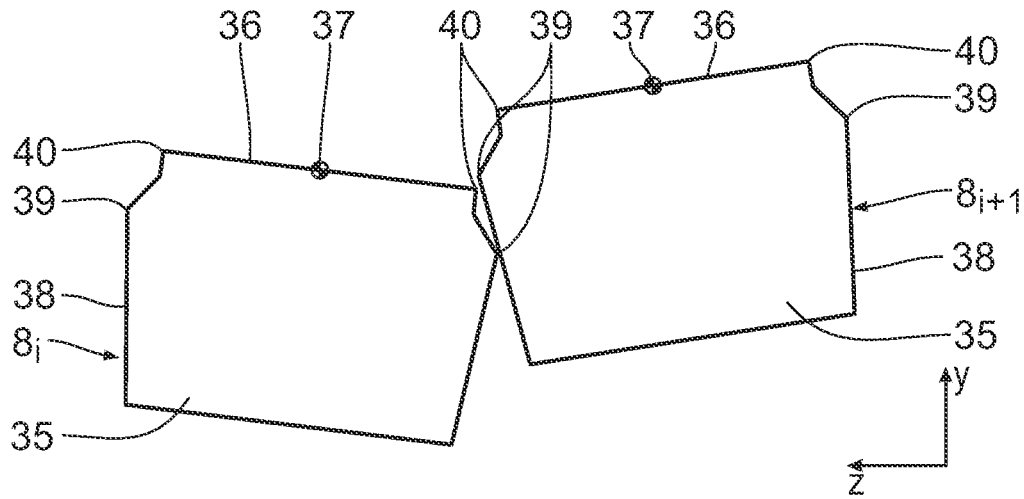

FIGS. 11 to 13 show examples of different setups when adjacent facets $8_1$, $8_{i+1}$ are tilted.

If the facets $8_1$, $8_{i+1}$ are tilted away from one another (FIG. 11), the adjacent edges 40 are not endangered or at least less endangered.

In the opposite case, that is to say if the adjacent facets $8_1$, $8_{i+1}$ are tilted toward one another, in principle collisions can occur. According to the disclosure, it is however envisaged to form the stop elements 38 in such a way that the stop edge 39 of one stop element 38 comes into contact with the other stop element 38. In principle, the stop element 38, for example its stop edge 39, may also strike another area of the facet main body 35 of the adjacent facet $8_i$.

However, it should be ensured that the area in which contact (a collision) of a facet $8_i$ can occur is arranged at a distance from the reflection surface 36 of the respective facet $8_i$.

It can be easily deduced from the geometrical conditions that the overhang e by which the stop edge 39 protrudes laterally beyond the reflection surface 36, with the form shown of the stop element 38 a ratio to the height h of the reflection surface 36 above the plane through the stop edges 39, is desirably at least as great as the tangent of three times the side angle b:e:h≥tan(3b). In the case of a side angle b of 40 mrad, the following applies for example: e:h≥120 μm/mm. With such a form of the stop elements 38, the edges 40 of the reflection surface 36 are protected against collisions for all possible tilting positions of the facets $8_i$.

As illustrated by way of example in FIG. 13, this also applies to the case of an additional actuation around the second tilting axis. In the present case, this primarily leads to a relative displacement of the two facets $8_i$, $8_{i+1}$ in the z direction. This can lead to the other facet $8_i$ respectively being endangered. However, with the shown form of the stop elements 38, this is also protected by the stop elements, for example in such a way that the edges 40 of their reflection surface 36 cannot collide.

As is also evident by way of example from FIG. 13, the extent of the stop elements 38 in the z direction is dependent on the maximum tilting range around the y axis. It can be ensured by a sufficient extent of the stop elements 38 in the z direction that, irrespective of the tilting position around the y axis, the stop elements 38 offer a stop surface in order to protect the edges 40 of the reflection surface 36 against collisions.

For a value of the overhang e of the stop edges 39 beyond the reflection surface 36, for example in the direction parallel to the reflection surface 36 or perpendicular to the respective tilting axis, the following factors can be taken into account:

Manufacturing tolerances in the manufacture of the facet main body 35 usually lie in the range of 10 µm to 50 µm.

The stop elements 35 may become worn over the lifetime of the facets $8_i$. In the event of a collision, there can be a maximum indentation of the stop edge 39 in the range of at most a few µm. This depends, among other things, on the material of the stop elements 38 and/or on the impact angle in the event of a collision. As will be described in more detail below, it may be envisaged to form the stop edges 39 in a rounded manner. This can reduce the Hertzian pressure in the event of a collision.

The overhang e is for example dependent on the displacement range (actuation range) of the facets $8_i$. In addition, the absolute value of the overhang e is dependent on the distance between the stop edge 39 and the edge 40 of the reflection surface 36 to be protected, for example on the height h. The smaller this distance or the height h is, the smaller the overhang e can be chosen to be.

An overhang e in the range of 20 µm to 100 µm has proven to be relatively useful.

In order to keep the distance between adjacent reflection surfaces 36 as small as possible, a smaller overhang e can be advantageous. The distance between adjacent facet main bodies 35 in a neutral position of the facets $8_i$, $8_{i+1}$, for example a distance between the stop edges 39 of adjacent facets $8_i$, $8_{i+1}$ that are closest to one another, can be <100 µm, for example at most 50 µm. These statements can apply to the distance between two adjacent reflection surfaces 36, for example in the neutral position of the facets $8_i$, $8_{i+1}$, or for example in a position thereof in which their surface normals run parallel to one another.

Figure 14:
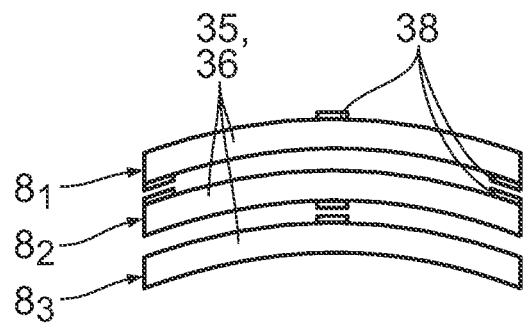
Figure 15:
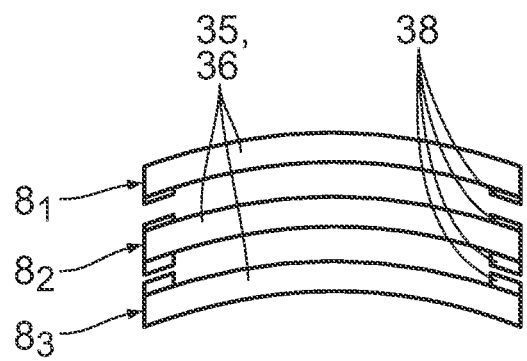

A further aspect of the disclosure is described below with reference to FIGS. 14 and 15.

This aspect relates to the arrangement of the stop elements 38 on the facet main body 35. According to the disclosure, it has been recognized that the constriction, that is to say the point of the smallest distance between two adjacent facets $8_i$, $8_{i+1}$, is not always in the area of their free ends. In addition, it may be that the nominal width of the gap 32 between adjacent facets $8_i$, $8_{i+1}$ varies over the length of the facets $8_i$, $8_{i+1}$.

According to the disclosure, it may therefore be envisaged to arrange stop elements 38 on the facet main body 35 depending on the position of the constriction. The stop elements 38 may for example not only be arranged at the ends on the facet main body 35. This is shown by way of example in FIG. 14 for the facets $8_1$, $8_2$. The stop elements 38 may however also be arranged centrally on the facet main body 35. This is shown by way of example in FIG. 14 for the facets $8_2$, $8_3$.

As an alternative to this, the amount of the overhang e may be chosen differently. This is shown by way of example in FIG. 15. Here the overhang e of the stop elements 38 between the facets $8_2$ and $8_3$ is chosen to be larger than the amount of the overhang e between the facets $8_1$ and $8_2$. This also means that the small gap width in the central area of the facets $8_2$, $8_3$ can be taken into account.

In other words, it is possible to choose the position of the arrangement of the stop elements 38 flexibly, as desired. As an alternative to this, it is possible to arrange the stop elements 38 in each case at a predetermined position on the facet main body 35. In this case for example, the amount of the overhang e can be flexibly adapted to the gap width.

A predetermined position, the same for all facets $8_i$, of the arrangement of the stop elements 38 on the facet main body 35 can have the advantage that the variety of facet features is reduced. This makes programming of the facet contours easier.

According to a further variant, it is envisaged to form the stop edge 39 over the entire length of the facets $8_i$. The stop edge 39 may for example be formed over the entire circumferential area of the facet main body 35. The stop edge 39 may be formed here as continuous. It may also be formed as interrupted. This can allow weight to be saved.

For example, for reasons of weight saving, it may be advantageous to arrange stop elements 38 only in the critical areas on the facet main body 35. For example in the case of a relatively great tilting range, for example a tilting range of more than 40 mrad, it may be advantageous to arrange stop elements 38 only in the area of the free ends of the facets $8_i$.

The stop element 38 may for example only be arranged at discrete locations in the longitudinal direction of the facet main body 35. For example, a maximum of 10, for example a maximum of 8, for example a maximum of 6, for example a maximum of 4, for example 2 stop elements 38 may be arranged on the facet main bodies 35. The stop elements 38 may have in each case an extent in the longitudinal direction of the facet main body 35 which is at most 10%, for example at most 5%, for example at most 3%, for example at most 2% of the length of the facet main body 35.

Overall, the stop elements 38 may be formed and arranged on the facet main body 35 in such a way that the mass moment of inertia of the facet main body 35 is increased by the arrangement of the stop elements 38 by at most 10%, for example at most 5%, for example at most 3%.

A further aspect of the disclosure relates to a potentially advantageous configuration of the facet main body 35. It has been recognized that a facet that is as lightweight as possible can be advantageous for dynamic reasons. On the one hand, this keeps the amplitudes low in the case of excitation and, on the other hand, the collision energy is reduced in the event of collisions. Even if, according to the disclosure, contacts of a facet $8_i$ with a stop surface are permitted, nevertheless care is desirably taken to ensure that such collisions do not have negative consequences, for example cause damage to the facet $8_i$ or lead to particle formation.

To form the facets $8_i$ with the lowest possible weight, for example with the lowest possible mass moment of inertia, for example with regard to the dynamically critical axes, for example the tilting axes, the facet main bodies 35 may be formed in a structurally optimized manner.

Figure 16:
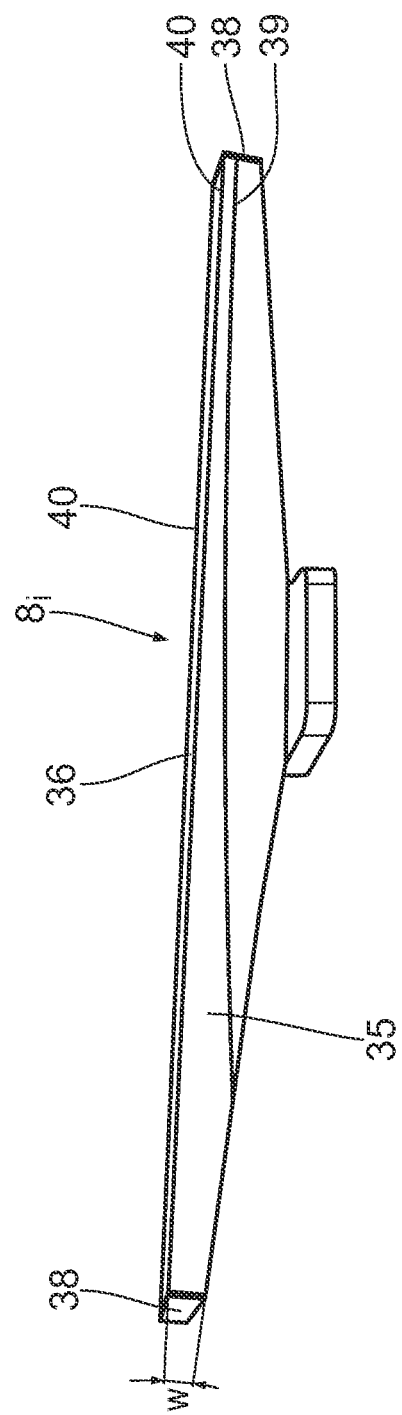
FIG. 16 shows by way of example a perspective view of a structurally optimized facet, FIG. 17 schematically shows a perspective partial view of a facet, the main body of which has a mechanism for reducing the mass moment of inertia and a mechanism for increasing the rigidity, FIG. 18 schematically shows a perspective view of a facet with a balancing element.

The facet main bodies 35 may for example have a mechanism for reducing the weight, for example a mechanism for reducing the mass moment of inertia. As a mechanism for reducing the weight of the facet main body 35 and for reducing its mass moment of inertia, it may for example be envisaged to form the facet main body 35 with a cross section that reduces toward the free end. For example, it is possible to reduce the height of the facet main body 35 toward the end of the facet. A corresponding form is shown by way of example in FIG. 16. The setting angle w between the underside of the facet main body 35 and the front side thereof lies for example in the range of 2° to 10°, for example in the range of 4° to 6°. Due to the thinner form of the facet main body 35 at its ends, its mass moment of inertia may be reduced by approximately 10% compared to a form that is not structurally optimized. At the same time, the rigidity of the facet main body 35 can be increased. The rigidity of the facet main body 35 can be increased for example by increasing the cross-sectional area toward the support point of the facet. The total mass of the facet main body 35 increases, but the mass moment of inertia decreases, since the cross section is reduced toward the free end. The mass moment of inertia is thus reduced overall over the entire length of the facet main body 35 and the rigidity is increased. For example, by reducing the cross-sectional area of the facet main body 35 toward its ends, the sag due to the dead weight of the facet main body 35 can be improved by a factor of more than two, for example more than three. These statements relate by way of example to a facet with a length of 120 mm, a width of 6.6 mm and an average height of 14 mm.

In addition, the desired rigidity may be displaced toward the actuator axis.

Figure 17:
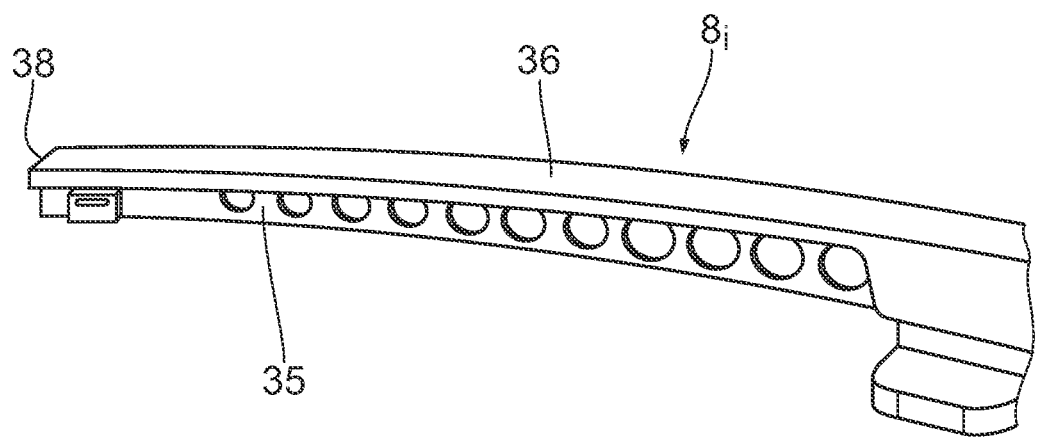

Another mechanism for reducing the weight, for example for reducing the mass moment of inertia of the facet main body 35, is shown by way of example in FIG. 17. According to this variant, bores are provided in the facet main body 35. The bores likewise lead to a weight saving. As an alternative or in addition to this, pockets may also be provided, for example from the underside of the facet main body 35 or from the side surfaces thereof. In addition, taperings of the cross section are also possible in other ways, for example by bevels on the sides.

Figure 18:
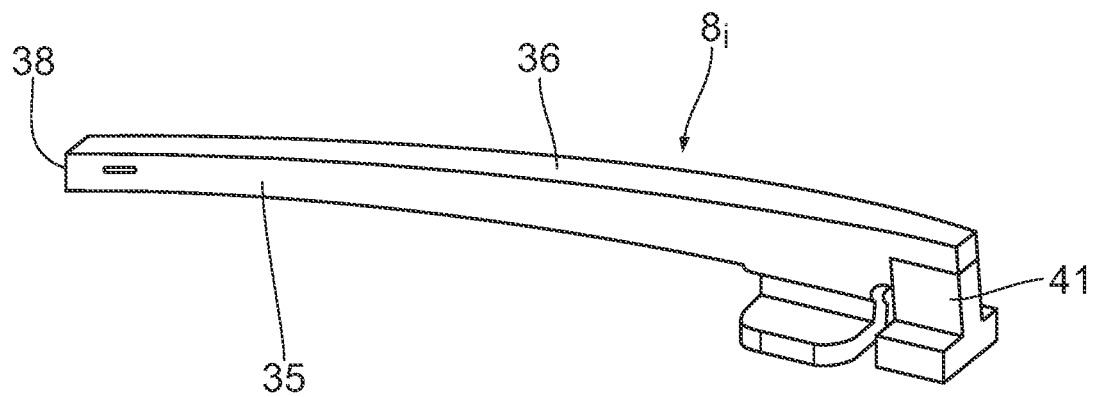
Figure 19:
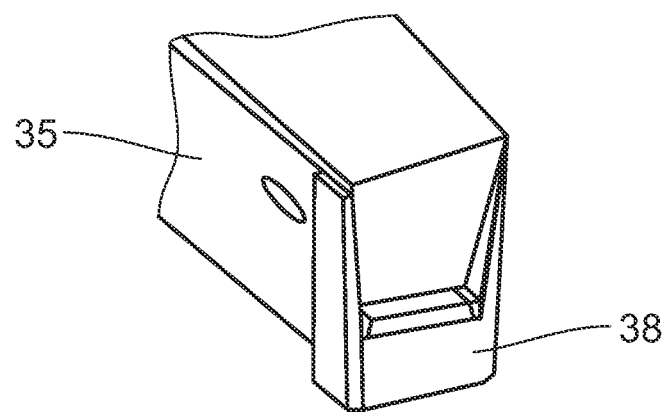
FIG. 19 shows by way of example a detailed view of the arrangement of a stop element, given by way of example, on the main body of a facet.

A further mechanism of optimizing the facet main body 35 is shown in FIG. 18. According to this variant, the facet main body 35 is mounted in a highly asymmetrical manner. A balancing element 41 is provided here in the area of the shorter free end.

The mass moments of inertia of the facet main body 35, for example around Rx, can be reduced by the mechanism(s) described above by up to 30%.

The stop elements 38 can have a small extent in the x direction, that is to say in the longitudinal direction of the facet main body 35. The stop elements 38 may for example have an extent in the x direction in the range of 1 mm to 3 mm. For example, the facets $8_i$ described above by way of example, for example together with the other moving masses of the manipulator, have a total moment of inertia $I_{yy}$ of around 180000 g·mm². The additional total moment of inertia $I_{yy}$ due to the stop elements 38 is less than 5000 m mm², i.e. less than 3% of the total moment of inertia $I_{yy}$.

According to a further variant, the weight, and consequently the moment of inertia additionally caused by the stop element 38, can be further reduced by clearances, for example bores or pockets. Such weight savings can be introduced into the stop element 38 for example on the end faces in the x direction. As a result, the relative proportion of the mass moment of inertia of the stop elements 38 in the total moment of inertia $I_{yy}$ of the facets $8_i$ can be reduced to less than 2%.

The stop elements 38 serve for example to protect the facets $8_i$, for example to protect their reflection surfaces 36, in the event of unexpected excitations and/or shocks. They also protect the facets for example against seismic load cases in which the excited vibration amplitudes can be a multiple of the width of the gaps 32 provided.

Further aspects of the disclosure are described below.

The stop elements 38 may be formed as separate components. For example, they may be placed on the facet main body 35. They are generally connected to the facet main body 35. In general, all conceivable connection techniques are possible here. The stop elements 38 may for example be glued, soldered, welded, screwed, clipped or shrunk or fitted onto the facet main body 35.

The form of the stop elements 38 as separate components can have the advantage that the stop elements 38 can be produced from a different material than the facet main body 35. They may also be produced from the same material. For example, they may be produced from copper or a copper alloy. This can be advantageous for example with regard to particle formation. In addition, using copper or a copper alloy to produce the stop elements 38 can have the advantage that, as a result of the relatively low hardness of copper, in the event of a collision there is a slight indentation at a point that is not disruptive. The formation of particles is largely prevented.

It is also possible to integrate the stop elements monolithically into the facet main body 35. For example, they may be formed in one piece with the facet main body 35. In this case, the stop elements 38 may be formed for example by the geometrical details, for example the shape of the facet main body 35. This can allow relatively simple and robust production.

Figure 20:
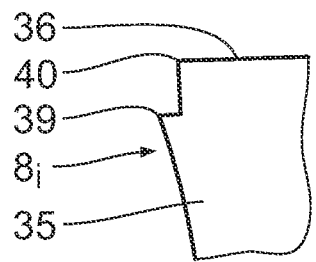
FIG. 20 to 22 show by way of example different forms of the boundary of a stop element, FIG. 23 schematically shows a view of a facet with a separate stop element for limiting the displacement range thereof, FIG. 24 schematically shows a cross section through adjacent facets with stop elements according to FIG. 23, FIG. 25 schematically shows a longitudinal section through a facet to illustrate an arrangement of the stop element according to FIG. 23 relative to a tilting axis of the facet and FIG. 26 schematically shows by way of example a variant in which the stop element is formed as a separate, lateral stop.
Figure 21:
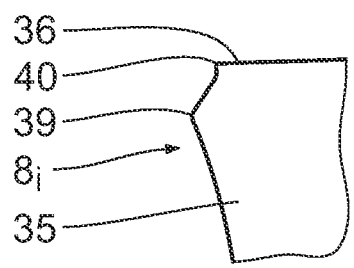
Figure 22:
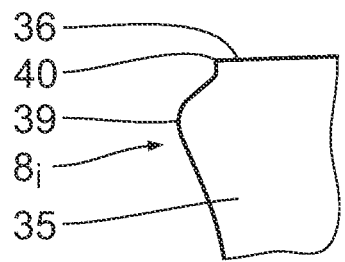

As shown by way of example in FIGS. 20 to 22, the form of the stop elements 38, for example their stop edge 39, may be sharp-edged (FIG. 20), non-sharp-edged, for example tapering flat (FIG. 21) or rounded (FIG. 22). A rounded, for example chamfered form, can make it possible to reduce the Hertzian pressure. In general, it represents a desirable embodiment.

Collision tests have shown that, after several hundred collisions with typical impact energy, there was only very little wear, for example an indentation in the contact area of at most 2 μm.

According to a further variant, the height h by which the reflection surface 36 is offset in the direction of its surface normal with respect to a plane through the stop edges 39 of the stop element 38 may also approach zero. This corresponds to the case where the used optical surface of the facets $8_i$ does not go as far as its geometrical periphery, for example not as far as the periphery of the facet main body 35. Such a form also has the effect that the reflection surfaces 36 do not collide in the event of a collision. However, in this case the reflection surfaces 36 are surrounded by a peripheral area which is not used to reflect the illumination radiation 4. As a result, the degree of filling of the facet mirror 7, and consequently the efficiency with regard to transmission, are reduced.

A further exemplary embodiment is described below with reference to FIGS. 23 to 25. For general details, reference is made to the previous embodiments.

In this exemplary embodiment, the stop surface is formed by a mechanism for limiting the displacement range of the facets $8_i$. According to the variant shown in the figures, a pin 42, which is also referred to as a snubber, serves as such a mechanism. The pin 42 enters a pocket 43 on the underside of the facet main body 35. The depth of entry is great enough to cover the entire tilting range. In principle, the pin 42 may also be tilted together with the facet main body 35.

Figure 23:
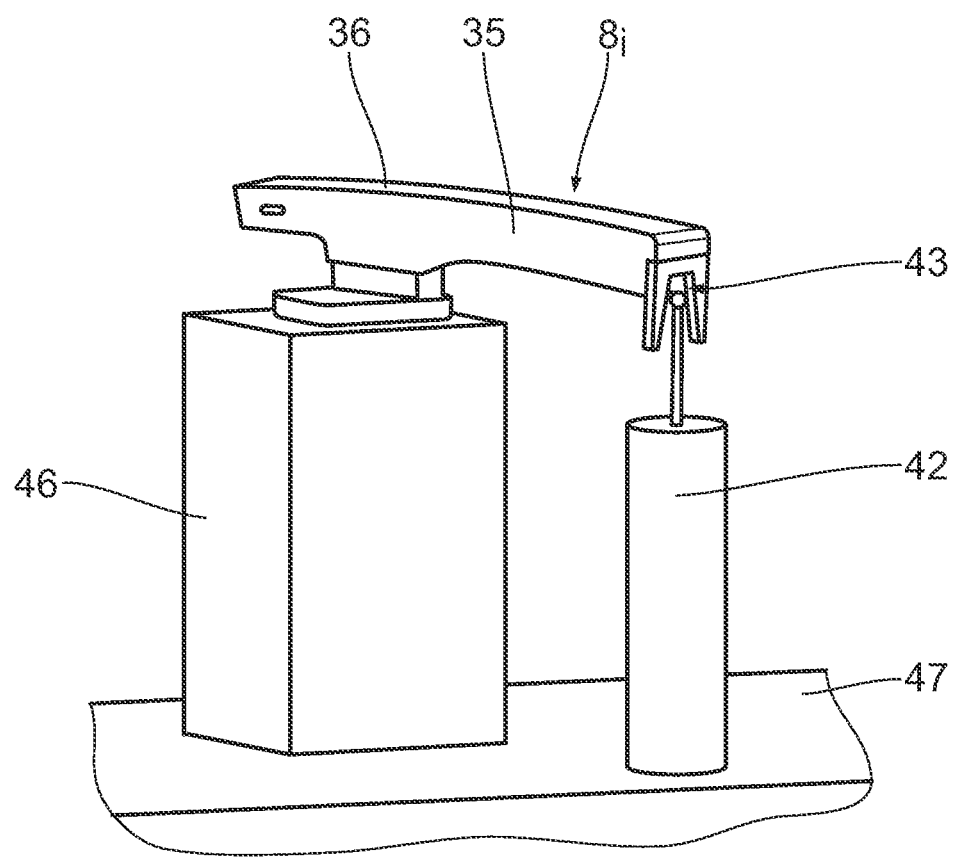
Figure 24:
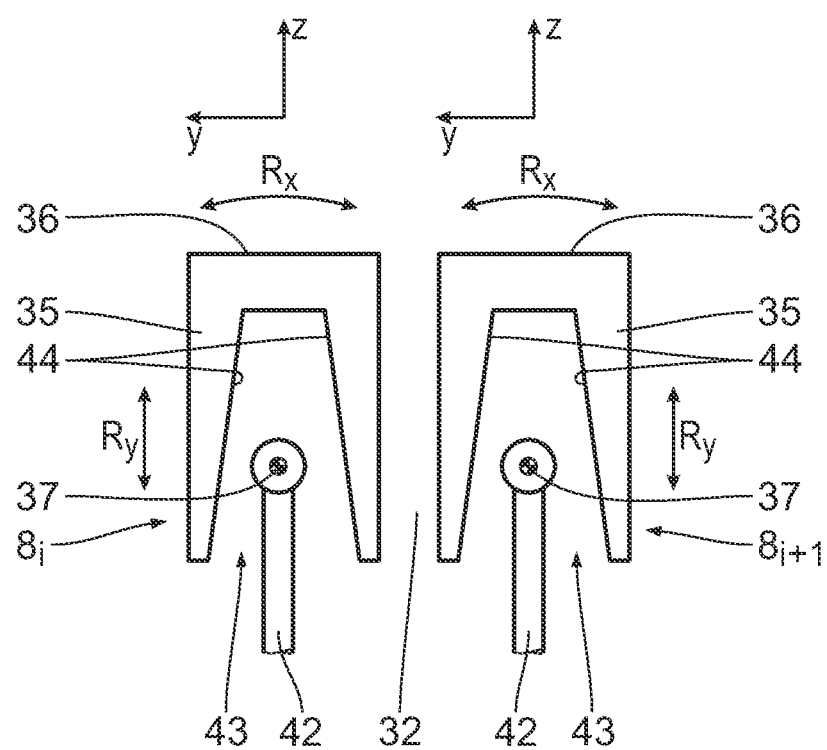

The pin 42 and a mounting 46 of the facet $8_i$ that is only shown in FIG. 23 are arranged on a common base plate 47.

The precise positioning of the pin 42, for example of the free end thereof that enters the pocket 43, may advantageously be adjustable.

The play between the pin 42 and a stop side 44 on the inside of the pocket 43 is smaller than the distance between two adjacent facets $8_i$, $8_{i+1}$, for example smaller than the width of the gap 32 between two adjacent facets $8_i$, $8_{i+1}$. The play between the pin 42 and the stop side 44 is for example smaller than the part of the gap 32 available for the TO tolerances. This ensures that the protective effect for the edges 40 of the reflection surface 36 is also ensured in this variant.

In order to reduce the play around the pin 42, it can be desirable to form and/or arrange the pin 42 in such a way that its free end runs in the area of the tilting axis 37 (the x axis in the case shown).

To further reduce the play, the pin 42 can be adjusted. The pin 42 may for example be formed as adjustable.

The pin 24 may for example be configured as spherical at its free end. This avoids impeding the tilting of the facets.

In the embodiments shown by way of example, the snubber is shown as a pin 42. It is also conceivable to form the snubber as a fork, that is to say with a number of free ends which encompass the facets.

Figure 25:
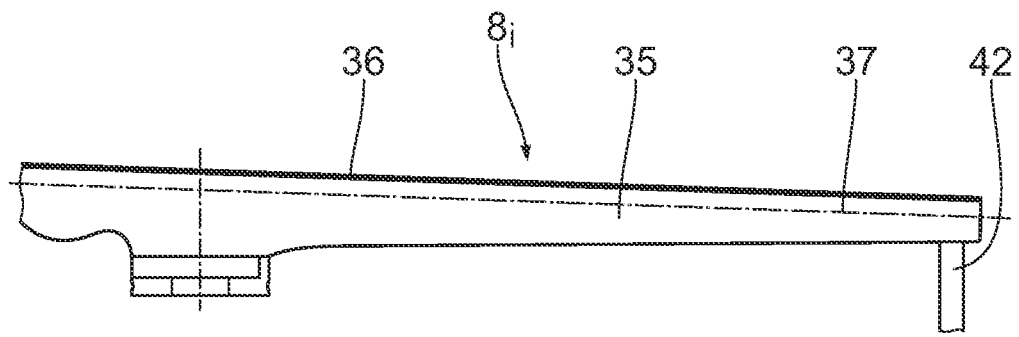
Figure 26:
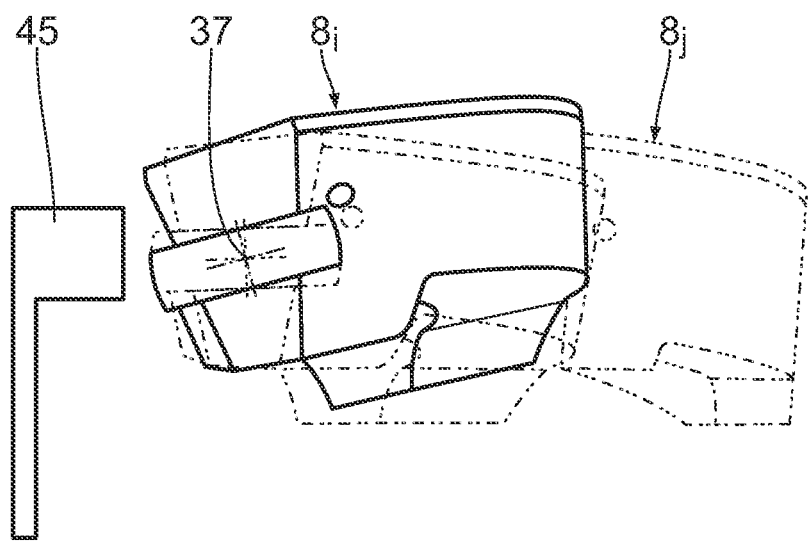

According to a further variant, shown by way of example in FIG. 25, a lateral stop 45 is provided instead of the pin 42.

In general, it should be noted that the facets $8_i$, for example their facet main body 35, have a displacement range such that they come into contact with a stop surface in certain displacement positions. The displacement positions may be reversibly actuable displacement positions. They may also be undesirable deflection positions which can occur in the case of transport or in the event of an earthquake, for example only in the case of transport or an earthquake but not in the case of controlled laying.

The stop surface may be formed here by a surface on a further optical element, for example a further facet main body 35 or a stop element 38 arranged thereon. It may also be formed by a separate mechanical detail, for example the pin 42 or the lateral stop 45.

All stop surfaces can be made of wear-resistant materials. They may also have a wear-resistant coating. This can prevent the generation of particles in the event of a collision. Any particles that are nevertheless generated could be collected in a collection container or in pockets that are formed by adjacent components.

What is claimed is:

1. A facet mirror, comprising:
   a plurality of displaceable individual facets, each facet comprising:
      a facet main body comprising at least one member selected from the group consisting of stop surfaces and stop elements; and
      a reflection surface supported by the main body,
   wherein:
      the individual facets comprise a first facet and a second facet;
      relative to an edge of the reflection surface of the first facet, the at least one member of the main body of the first facet is offset outwardly in a direction perpendicular to a tilting axis of the first facet;
      relative to an edge of the reflection surface of the second facet, the at least one member of the main body of the second facet is offset outwardly in a direction perpendicular to a tilting axis of the second facet;
      in a first position of the facet mirror, the first and second facets do not contact each other; and
      in a second position of the facet mirror, the at least one member of the first facet contacts the main body of the second facet without the edge of the reflection surface of the first facet contacting the edge of the reflection surface of the second facet.

2. The facet mirror of claim 1, wherein, for each of the first and second facets, when the facet mirror is in its first position and/or its second position, the facet is a distance from the at least one member of all other facets.

3. The facet mirror of claim 1, wherein, for each facet of the first and second facets, the facet has a displacement range such that adjacent individual facets contact the facet in at least one displacement position.

4. The facet mirror of claim 1, wherein, for each facet of the first and second facets, the facet is configured so that adjacent individual facets have a position in which they come into contact in an area of at least one member of the facet.

5. The facet mirror of claim 1, wherein, for each facet of the first and second facets, the at least one member comprises stop surfaces.

6. The facet mirror of claim 1, wherein, for each facet of the first and second facets, the at least one member comprises stop elements.

7. The facet mirror of claim 1, wherein:
   for each facet of the first and second facets, the at least one member comprises a stop element;
   the stop elements of the first and second facets define a pair on the facet main body such that its outer envelope protrudes beyond the reflection surface in a direction in a perpendicular projection to a partial area of the reflection surface enclosed by the envelope; and
   in the second position of the facet mirror, the stop elements of the first and second facets contact each other without the edge of the reflection surface of the first facet contacting the edge of the reflection surface of the second facet.

8. The facet mirror of claim 1, further comprising a mechanism configured to limit a displacement range of the individual facets.

9. A unit, comprising:
   the facet mirror of claim 1,
   wherein the unit is an illumination optical unit.

10. A system, comprising:
    a radiation source configured to produce illumination radiation; and
    an illumination optical unit comprising the facet mirror of claim 1,
    wherein the system is an illumination system.

11. A system, comprising:
    an illumination optical unit comprising the facet mirror of claim 1, the illumination optical unit configured to illuminate an object field; and
    a projection optical unit configured to project the object field into an image field,
    wherein the system is an optical system.

12. An apparatus, comprising:
    a radiation source configured to produce illumination radiation;
    an illumination optical unit comprising the facet mirror of claim 1, the illumination optical unit configured to illuminate an object field with the illumination radiation; and
    a projection optical unit configured to project the object field into an image field,
    wherein the apparatus is a projection exposure apparatus.

13. A method of using a projection exposure apparatus comprising an illumination optical unit and a projection optical unit, the method comprising:
    using the illumination optical unit to illuminate an image field with illumination radiation; and
    using the projection optical unit to project the image field into an object field,
    wherein the illumination optical unit comprises a facet mirror according to claim 1.

14. The facet mirror of claim 1, wherein, in the second position of the facet mirror, the at least one member of the first facet contacts the at least one member of the second facet without the edge of the reflection surface of the first facet contacting the edge of the reflection surface of the second facet.

15. The facet mirror of claim 1, wherein:
   the at least one member of the first facet comprises a first stop element;
   in the second position of the facet mirror, the first stop element contacts the main body of the second facet without the edge of the reflection surface of the first facet contacting the edge of the reflection surface of the second facet.

16. The facet mirror of claim 1, wherein:
   the at least one member of the first facet comprises a first stop element;
   the at least one member of the second facet comprises a second stop element;
   in the second position of the facet mirror, the first stop element contacts the second stop element without the edge of the reflection surface of the first facet contacting the edge of the reflection surface of the second facet.

17. The facet mirror of claim 16, wherein the first stop element is rounded or chamfered, and the second stop element is rounded or chamfered.

18. The facet mirror of claim 1, wherein the at least one member of the main body of the first facet is rounded or chamfered, and the at least one member of the main body of the second facet is rounded or chamfered.

19. The facet mirror of claim 1, wherein:
   the at least one member of the first facet comprises a first stop surface;
   in the second position of the facet mirror, the first stop surface contacts the main body of the second facet without the edge of the reflection surface of the first facet contacting the edge of the reflection surface of the second facet.

20. The facet mirror of claim 1, wherein:
   the at least one member of the first facet comprises a first stop surface;
   the at least one member of the second facet comprises a second stop surface;
   in the second position of the facet mirror, the first stop surface contacts the second stop surface without the edge of the reflection surface of the first facet contacting the edge of the reflection surface of the second facet.

21. The facet mirror of claim 1, wherein the reflection surface is configured to reflect EUV radiation.

* * * * *

UNITED STATES PATENT AND TRADEMARK OFFICE
CERTIFICATE OF CORRECTION

PATENT NO. : 11,789,367 B2
APPLICATION NO. : 17/695402
DATED : October 17, 2023
INVENTOR(S) : Willi Anderl et al.

It is certified that error appears in the above-identified patent and that said Letters Patent is hereby corrected as shown below:

In the Specification

Column 17, Line 41-42, delete "5000 m mm$^2$," insert --5000 g · mm$^2$,--.

Signed and Sealed this
Twelfth Day of December, 2023

Katherine Kelly Vidal
*Director of the United States Patent and Trademark Office*